(12) United States Patent
Bourne et al.

(10) Patent No.: US 9,095,054 B1
(45) Date of Patent: Jul. 28, 2015

(54) HIGH TEMPERATURE EQUALIZED ELECTRICAL PARASITIC POWER PACKAGING METHOD FOR MANY PARALLELED SEMICONDUCTOR POWER DEVICES

(71) Applicants: Arkansas Power Electronics International, Inc., Fayetteville, AR (US); Leonard Schaper

(72) Inventors: Jack Bourne, Morrisville, PA (US); Jared Hornberger, Fayetteville, AR (US); Alex Lostetter, Fayetteville, AR (US); Brice McPherson, Fayetteville, AR (US); Ty McNutt, Farmington, AR (US); Brad Reese, Fayetteville, AR (US); Marcelo Schupbach, Raleigh, NC (US); Robert Shaw, Fayetteville, AR (US); Eric Cole, Rogers, AR (US); Leonard Schaper, Naples, FL (US)

(73) Assignee: Arkansas Power Electronics International, Inc., Fayetteville, AR (US)

( * ) Notice: Subject to any disclaimer, the term of this patent is extended or adjusted under 35 U.S.C. 154(b) by 0 days.

(21) Appl. No.: 14/054,089

(22) Filed: Oct. 15, 2013

Related U.S. Application Data

(60) Provisional application No. 61/713,109, filed on Oct. 12, 2012.

(51) Int. Cl.
*H01L 23/52* (2006.01)
*H05K 7/02* (2006.01)
*H05K 1/11* (2006.01)

(52) U.S. Cl.
CPC ...... *H05K 7/02* (2013.01); *H05K 1/11* (2013.01)

(58) Field of Classification Search
None
See application file for complete search history.

(56) References Cited

U.S. PATENT DOCUMENTS

| | | | |
|---|---|---|---|
| 5,109,185 A * | 4/1992 | Ball | 323/207 |
| 6,151,226 A * | 11/2000 | Chen et al. | 363/26 |
| 6,307,755 B1 * | 10/2001 | Williams et al. | 361/813 |
| 6,738,258 B2 * | 5/2004 | Bijlenga et al. | 361/704 |
| 7,687,903 B2 * | 3/2010 | Son et al. | 257/723 |
| 7,786,486 B2 * | 8/2010 | Casey et al. | 257/76 |
| 8,018,056 B2 * | 9/2011 | Hauenstein | 257/730 |
| 8,368,210 B2 * | 2/2013 | Hauenstein | 257/724 |
| 2003/0089523 A1 * | 5/2003 | Hoffmeyer | 174/261 |
| 2003/0107875 A1 * | 6/2003 | Bijlenga et al. | 361/704 |
| 2004/0080057 A1 * | 4/2004 | Hoffmeyer | 257/786 |
| 2004/0188706 A1 * | 9/2004 | Chang et al. | 257/177 |
| 2006/0062023 A1 * | 3/2006 | Patwardhan et al. | 363/15 |
| 2006/0176648 A1 * | 8/2006 | Inoue et al. | 361/600 |
| 2008/0258556 A1 * | 10/2008 | Ewing et al. | 307/23 |
| 2009/0303711 A1 * | 12/2009 | Remus et al. | 362/234 |
| 2011/0011300 A1 * | 1/2011 | Gambach et al. | 105/49 |
| 2014/0049230 A1 * | 2/2014 | Weyh, Thomas | 323/207 |
| 2014/0097747 A1 * | 4/2014 | Bader, Michael | 315/3 |
| 2014/0159650 A1 * | 6/2014 | Beauregard | 320/107 |
| 2014/0226377 A1 * | 8/2014 | Goetz et al. | 363/65 |
| 2014/0328086 A1 * | 11/2014 | Hueckel et al. | 363/17 |
| 2014/0340940 A1 * | 11/2014 | Ouyang et al. | 363/17 |

* cited by examiner

*Primary Examiner* — David E Graybill
(74) *Attorney, Agent, or Firm* — Baker & Hostetler LLP (57) ABSTRACT

A four quadrant power module with lower substrate parallel power paths and upper substrate equidistant clock tree timing utilizing parallel leg construction in a captive fastener power module housing.

2 Claims, 7 Drawing Sheets

HIGH TEMPERATURE EQUALIZED ELECTRICAL PARASITIC POWER PACKAGING METHOD FOR MANY PARALLELED SEMICONDUCTOR POWER DEVICES

STATEMENT REGARDING FEDERALLY SPONSORED RESEARCH OR DEVELOPMENT

This invention was made with government support under grant FA8650-10-C-2124 awarded by the United States Air Force. The United States government has certain rights in the invention.

CROSS-REFERENCE TO RELATED APPLICATIONS

The present application is a continuation in part of U.S. Provisional application 61/713,109 filed on Oct. 12, 2012 entitled A HIGH TEMPERATURE EQUALIZED ELECTRICAL PARASITIC POWER PACKAGING METHOD FOR MANY PARALLELED SEMICONDUCTOR POWER DEVICES which is hereby incorporated by reference in its entirety.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in high temperature electronics. The demands for high-performance power electronics systems are surpassing the power density, efficiency, and reliability limitations defined by the intrinsic properties of silicon (Si) based semiconductors and traditional silicon packaging solutions. The advantages of silicon carbide (SiC) are well known, including high temperature operation, high voltage blocking capability, high speed switching, and high energy efficiency. These advantages, however, are severely limited by conventional power packages, particularly at temperatures higher than 175° C. and >100 kHz switching speeds.

2. Description of the Known Art

As will be appreciated by those skilled in the art, power circuits are known in various forms. Patents disclosing information relevant to power modules or packages include: U.S. Pat. No. 7,687,903, issued to Son, et al. on Mar. 30, 2010 entitled Power module and method of fabricating the same; U.S. Pat. No. 7,786,486 issued to Casey, et al. on Aug. 31, 2010 entitled Double-sided package for power module; U.S. Pat. No. 8,018,056 issued to Hauenstein on Sep. 13, 2011 entitled Package for high power density devices; U.S. Pat. No. 8,368,210 issued to Hauenstein on Feb. 5, 2013 entitled Wafer scale package for high power devices; U.S. Pat. No. 6,307,755 issued to Williams, et al. on Oct. 23, 2001 entitled Surface mount semiconductor package, die-leadframe combination and leadframe therefore and method of mounting leadframes to surfaces of semiconductor die. Each of these patents is hereby expressly incorporated by reference in their entirety. From these prior references it may be seen that these prior art patents are very limited in their teaching and utilization, and an improved power module is needed to overcome these limitations.

SUMMARY OF THE INVENTION

The present invention is directed to an improved power module using parallel power paths with clock tree gate circuitry in a four quadrant power module. Innovations and features in this module include the following:

A multi-substrate layout technique utilizing the entire package width for power conduction and interconnection.

A method to implement high current power parallel path conduction through the module with equalized electrical parasitic along all current paths and through many paralleled power devices Novel interconnection scheme allowing the user to configure the four switch positions in the assembly as either a half-bridge, full-bridge, or series connected arrangement.

Capability to house multiple devices in parallel including active switches and diodes arranged such that turn-on and turn-off events are simultaneous.

"Clock tree" or "corporate fed" gate and source kelvin connections provide equidistant paths to each paralleled device, allowing the control signals to reach each device concurrently.

High temperature materials, design techniques, devices, attaches, and assembly procedures allow operation of up to 250° C. at the device junction.

Novel lead frame design with pre-bending for low profile.

Lid design for encapsulation and final seal.

Interlocking of housing with captive nuts around lead frames.

In-module high temperature gate-source board for inclusion of passive and active components for high speed gate drive with limited oscillations—includes equalized parasitic clock-tree approach for power device gate paths to guarantee near simultaneous switching of many paralleled power devices.

Switch control kelvin connections with pin, blade, or other connector to provide adequate low-profile current conduction capability and gate drive implementation.

A method to implement a modular building block approach, employing the invention as multiple power topology interchangeable configurations.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
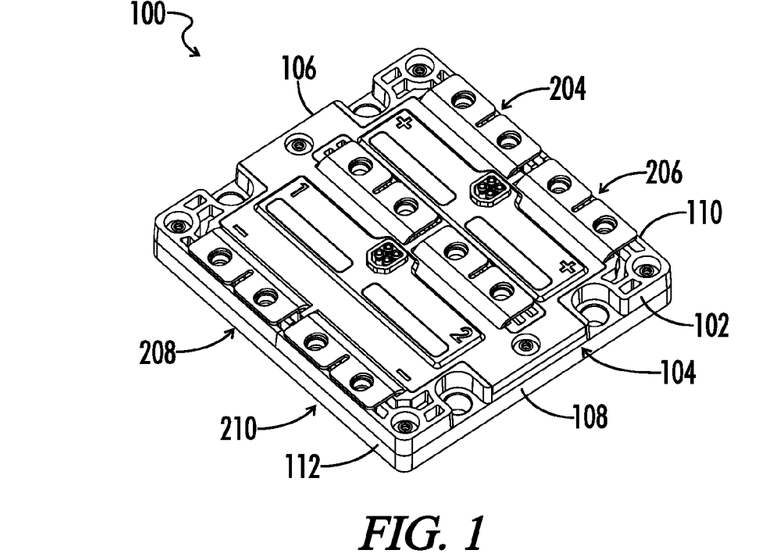
FIG. 1 is an overview of a four quadrant power module.

As shown in FIG. 1 of the drawings, one exemplary embodiment of the present invention is generally shown as a four quadrant power module 100. The four quadrant power module 100 includes a top surface 102, bottom surface 104, left side 106, right side 108, head edge 110, and foot edge 112.

Figure 2:
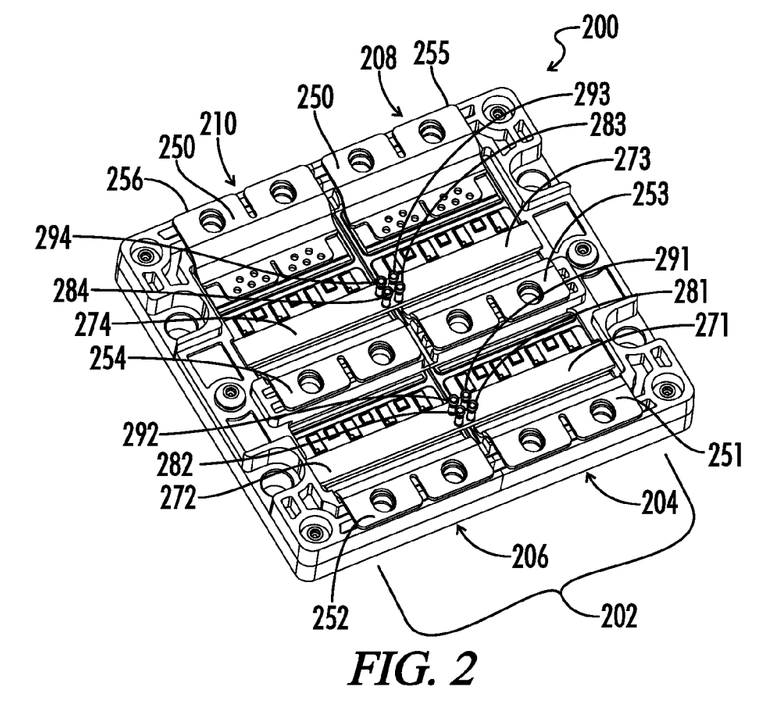
FIG. 2 is a rotated view of the four quadrant power module with the lid removed.

FIG. 2 shows the power circuit 200 using power devices 202 mounted in a first quadrant power section 204, second quadrant power section 206, third quadrant power section 208, and fourth quadrant power section 210. These power sections 204-210 are each connected with power contacts 250. The power contacts include the first power contact 251, second power contact 252, third power contact 253, fourth power contact 254, fifth power contact 255, and sixth power contact 256. Each power section 204, 206, 208, 210 includes an upper interconnection substrates 270.

The upper interconnection substrates 270 are shown as the first gate source interconnection substrate 271 with first gate contact 281 and first source contact 291, the second gate source interconnection substrate 272 with second gate contact 282 and second source contact 292; the third gate source interconnection substrate 273 with third gate contact 283, and third source contact 293; and the fourth gate source interconnection substrate 274 with fourth gate contact 284 and fourth source contact 294.

The entire module width is used for power conduction, minimizing impedances. By using two substrates (one for power and one for control), the high current paths (and associated inductances) for the paralleled devices may be equalized for smooth switching events.

Figure 3:
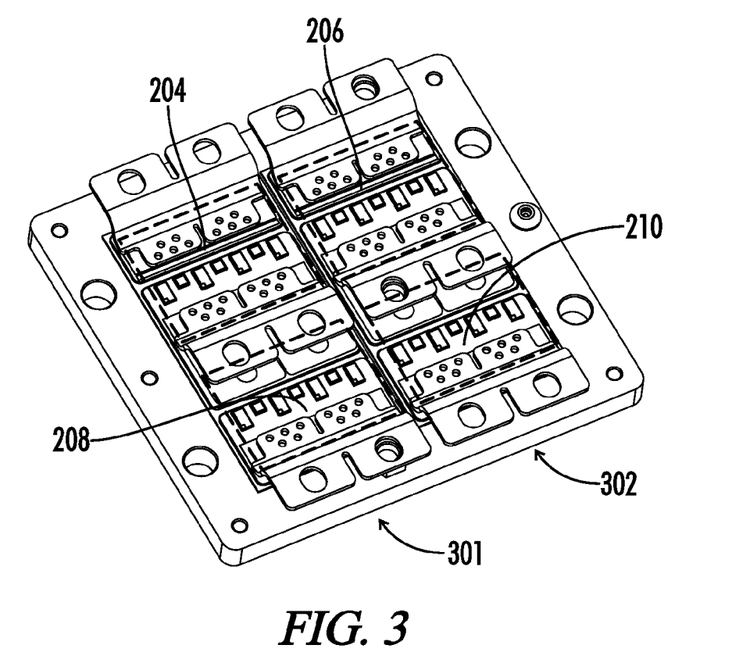
FIG. 3 is a view of the lower substrate with the quadrants indicated.

FIG. 3 shoes how the planar parallel nature is formed with the first quadrant power section 204 and third quadrant power section 208 parallel with the second quadrant power section 206 and fourth quadrant power section 210 to form a first switch leg 301 parallel to a second switch leg 302.

Figure 4:
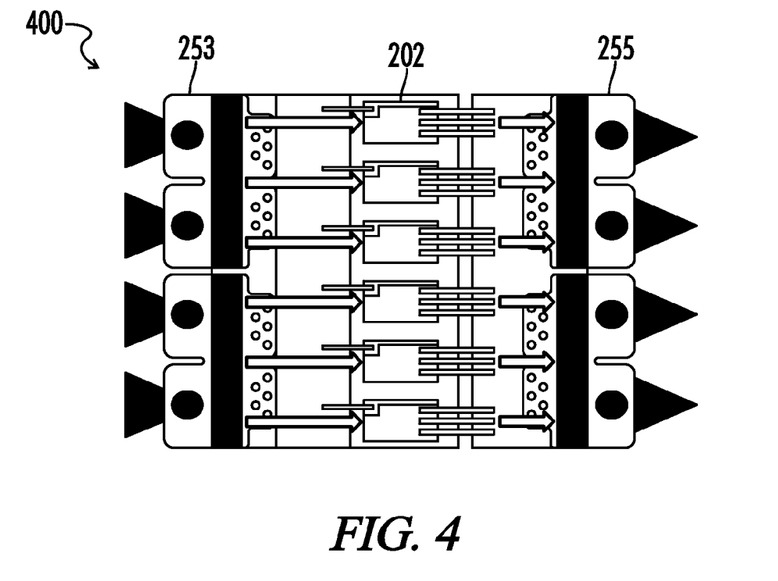
FIG. 4 is a schematic representation of the parallel path construction.

FIG. 4 shows a depiction of the multiple power devices 202 arranged on a parallel matched length current path distribution 400 with each device 202 connected to the power contacts 253, 255 so that each of the paths are parallel and matching in length to each of the other paths to provide for matched switching performance from the module 100.

Figure 5:
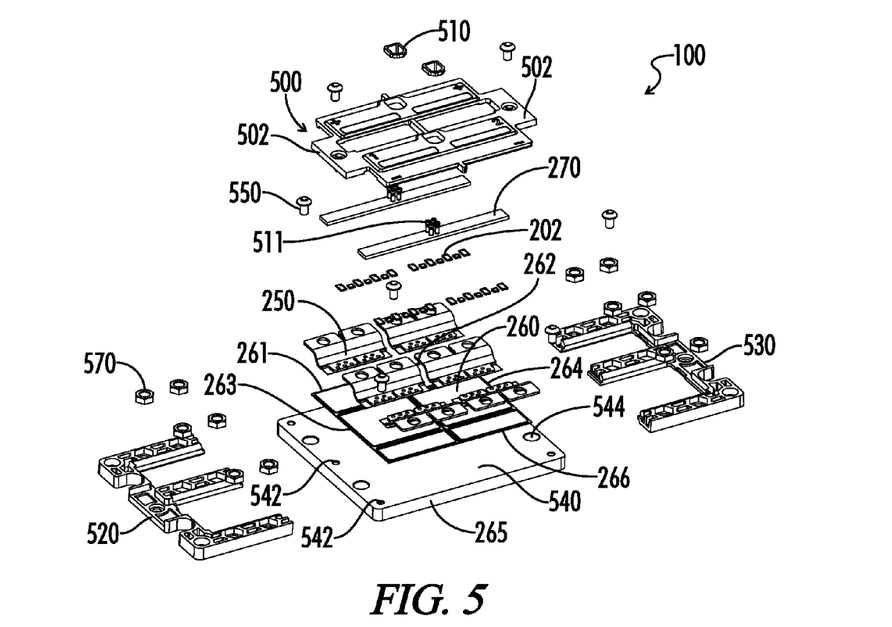
FIG. 5 is an exploded view of the module construction.

FIG. 5 shows an exploded view of the module 100 and how the individual module elements fit together. The module 100 includes a housing 500 with a gate source insert 510, lid housing section 502, connecting bolts 550, upper interconnection substrates 270, power devices 202, power contacts 250, captive fasteners 570, lower power substrates 260, left side housing section 520, right side housing section 530 and composite base plate 540. The composite base plate 540 defines threaded bolt apertures 542, and mounting apertures 544. The captive fasteners 570 are #6-32 nuts in the preferred embodiment. The lower power substrates 260 are best understood as the first power substrate 261, second power substrate 262, third power substrate 263, fourth power substrate 264, fifth power substrate 265, and sixth power substrate 266 with each 89 connected to the appropriate power contact 250.

Figure 6:
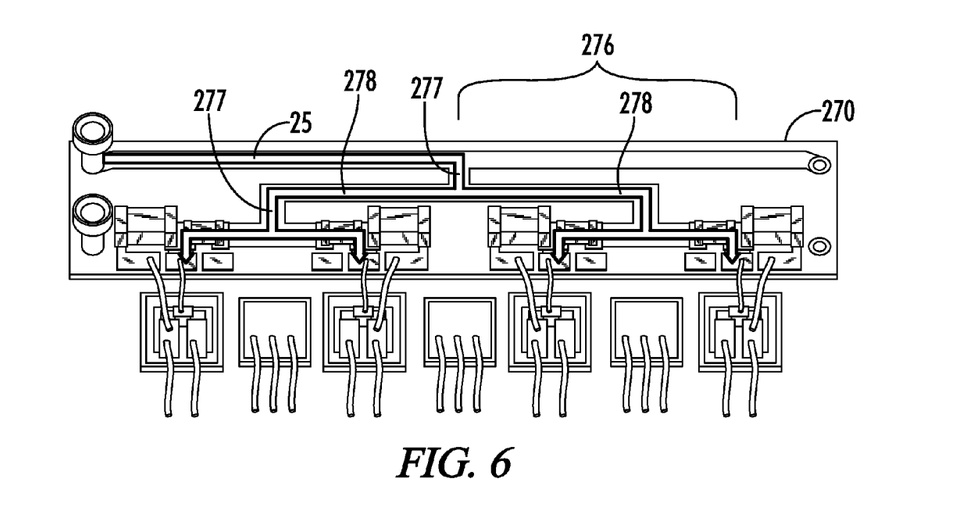
FIG. 6 is a magnified view of the upper substrate and clock tree circuitry.

FIG. 6 shows how the upper interconnection substrates 270 are fabricated with a multi-layer high temperature PCB material. Traces 275 are stacked counter-inductively and arranged in a "clock tree" equidistant path layout 276, shown using central trunks 277 splitting into branches 278. A clock tree layout equalizes the distance control and sense currents travel to reach each device, ensuring simultaneous turn-on and turn-off events. This is critical to increase switching speeds and for paralleling large numbers of devices, as a cascading transition places unnecessarily large electrical and thermal stresses on some of the devices in the switch position. By using a separate substrate to accomplish this feature, the power path is unaffected and also equal between the switches. Another key benefit to using a separate PCB for the control signals is the opportunity to incorporate individual gate resistors and capacitors (if necessary) to increase stability.

Figure 7:
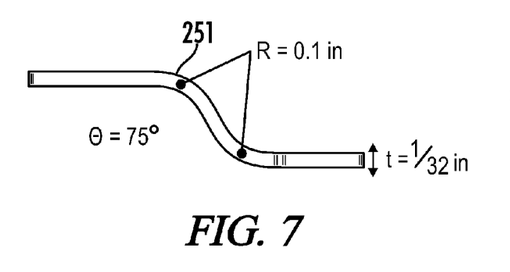
FIG. 7 is a side view of a power contact.
Figure 8:
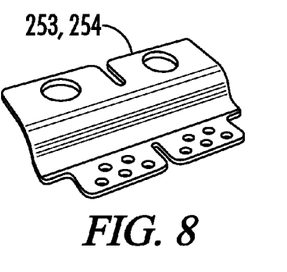
FIG. 8 is an isometric view of the third power contact.

FIGS. 7 and 8 show the power contacts 250 are fabricated through photochemical etching, following by electroplating, and finished with a bending process in a press-brake with precision bend hardware to accurately from the S-bend structure. A slight angle and generous radius is placed at the bend sites to facilitate this process without overly stressing the metal. This particular geometrical configuration provides minimal stress over the life of the part.

Figure 9:
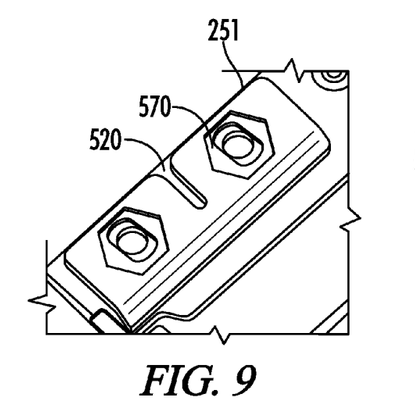
FIG. 9 is a magnified view of the captive fasteners at the edge of the power module.
Figure 10:
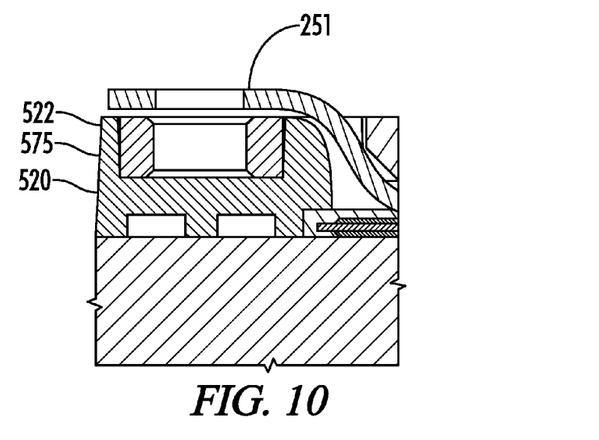
FIG. 10 is a cutaway schematic view of the captive fastener construction.

FIGS. 9 and 10 show how the power contacts 250 and sidewall housing sections 520, 530 are designed to hold a "captive nut" fastener 570 underneath the power contacts 250 such that an effective bolted connection can readily be made to the module 100. The nut 570 is freely floating such that it is not adhesively bonded to the plastic housing. This allows it to pull up into the power contacts 250, flexing the power contact 250 into the external bussing and not pulling it down towards the plastic, thereby enhancing the quality of the connection.

Figure 11:
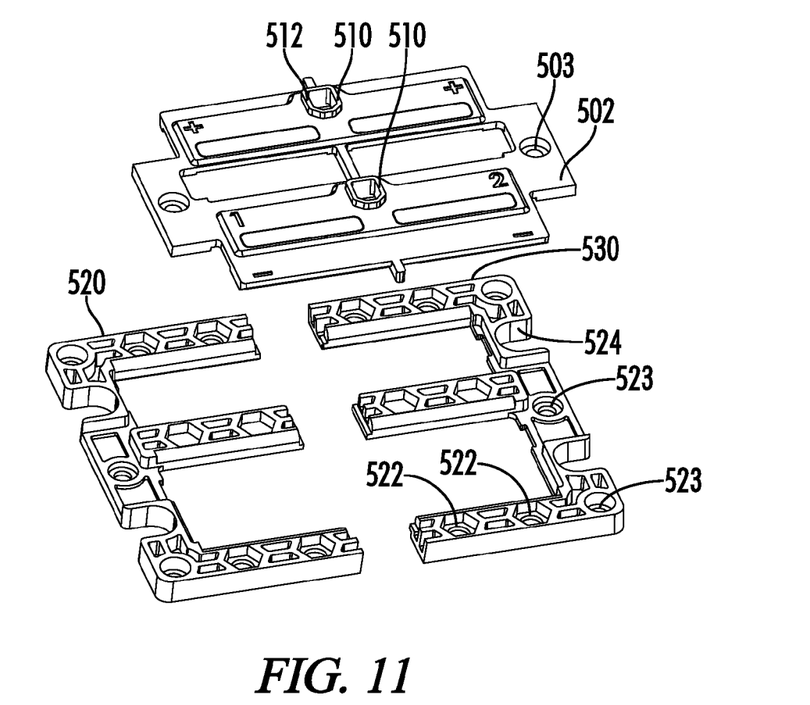
FIG. 11 is an exploded view of the molded housing components.

FIGS. 5 and 11 show the primary molded housing parts of the housing 500 including the lid housing section 502, gate source insert 510 with connection apertures 512, left side housing section 520, and right side housing section 530. The lid housing section 502 includes lid bolt securing apertures 503. The left and right side housing sections 520, 530 each include fastener capturing apertures 522, side bolt securing apertures 523, and clearance apertures 524. In order to place the left and right housing sections, 520, 530 with the captive nut fasteners 570 in the module 100 after the lead frame attach, the housing 500 assembly is designed in multiple pieces which slide in the sides and are bolted down with the connecting bolts 550 visible in FIGS. 1 and 5 and sealed with the epoxy seal 560 visible in FIG. 13. The insert 510 collars are included around the gate-source kelvin connections for support. These may either be standalone parts as pictured, or molded in the lid itself to reduce the part count.

Figure 12:
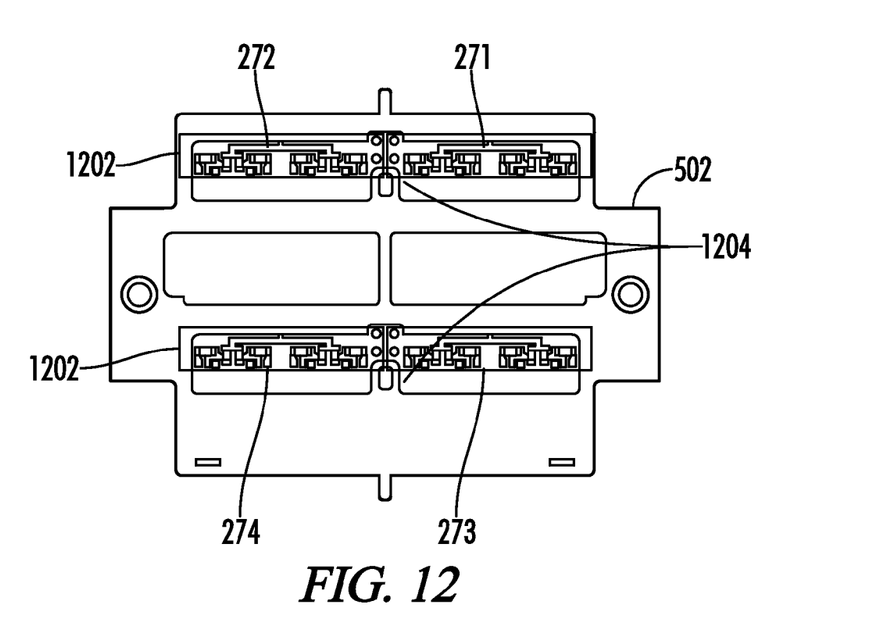
FIG. 12 is a bottom view of the lid indicating the clamp positions.

FIG. 12 shows how the bottom 505 of the lid 502 was designed to compressively "clamp" the gate/source kelvin board in place. The lid 502 was constructed with edge clamps 1202 formed as bars the hold the edge of the boards and u shaped center clamps 1204 to hold the central portion of the boards as features that were molded in the plastic as shown.

Figure 13:
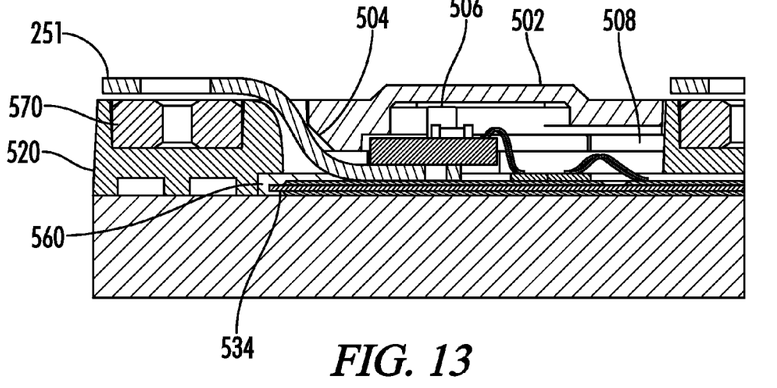
FIG. 13 is a partial schematic side view of the module construction.

FIG. 13 shows how the plastic housings were carefully designed to provide the necessary clearances between critical components and to provide a good "fit" without wasting excessive space. The lid housing section 502 is formed with a lower profiled power contact clearance 504, a raised gate source component clearance 506, and a power wire bond clearance 508. Also, the left side housing section 520 and right side housing section 530 are formed with an upper profiled power contact clearance 532 and a lower epoxy overhang 534 for the epoxy seal 560.

The location of the switch positions and external connections were carefully considered and designed in a novel arrangement that allows for a high degree of flexibility for the user to configure the same module into a variety of building block power system configurations. There are six connection points, three per switch leg, representing the high side, low side, and output connections in the half bridge legs. Through external bussing, a half bridge, full bridge, or series connected arrangement can be formed.

Figure 14:
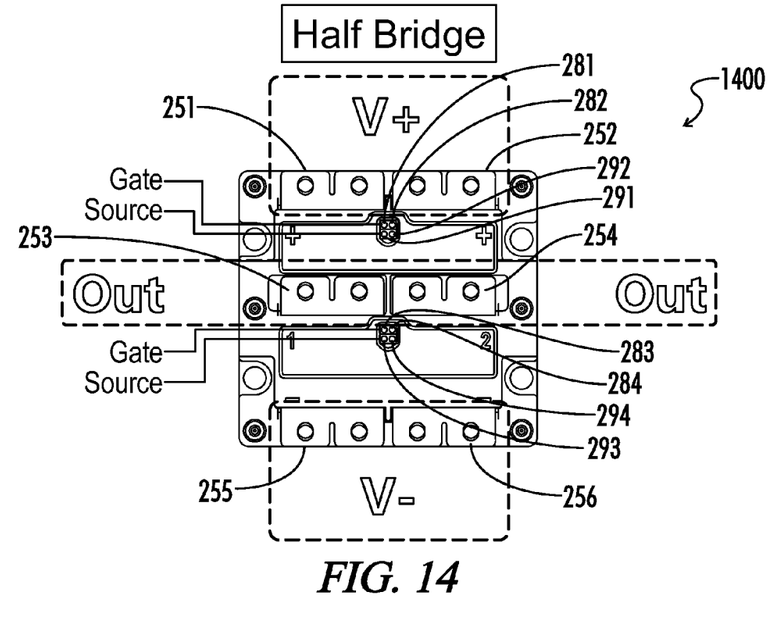
FIG. 14 is a schematic view of a half bridge configuration.

FIG. 14 shows a half bridge connection 1400. For a half bridge configuration 1400, the two switch legs are shorted together by shorting the first power contact 251 with the second power contact 252; the third power contact 253 with the fourth power contact 254; and the fifth power contact 255 with the sixth power contact 256 to form V+, Output, and V−. Also, the gate/source kelvin connections are shorted across the legs, with the First gate contact 281 with the Second gate contact 282, the First source contact 291 with the Second source contact 292; and the Third gate contact 283 with the Fourth gate contact 284, and then the Third source contact 293 with the Fourth source contact 294, as shown.

Figure 15:
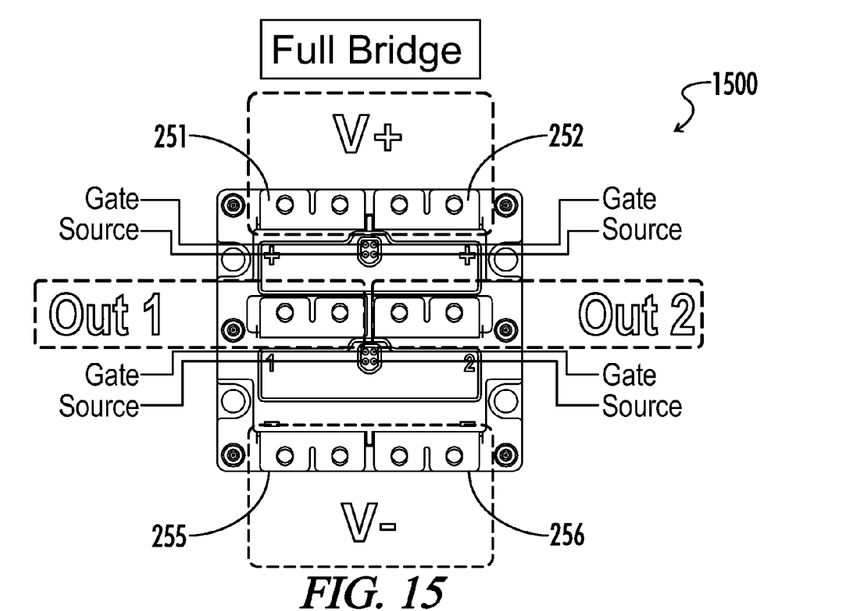
FIG. 15 is a schematic view of a full bridge configuration.

FIG. 15 shows a full bridge connection 1500. The full bridge connection 1500 is very similar, but splits the outputs and the gate/source kelvin connections between the phase legs. This is done by shorting the first power contact 251 with the second power contact 252 to form V+, and the fifth power contact 255 with the sixth power contact 256 to form V− as shown.

Figure 16:
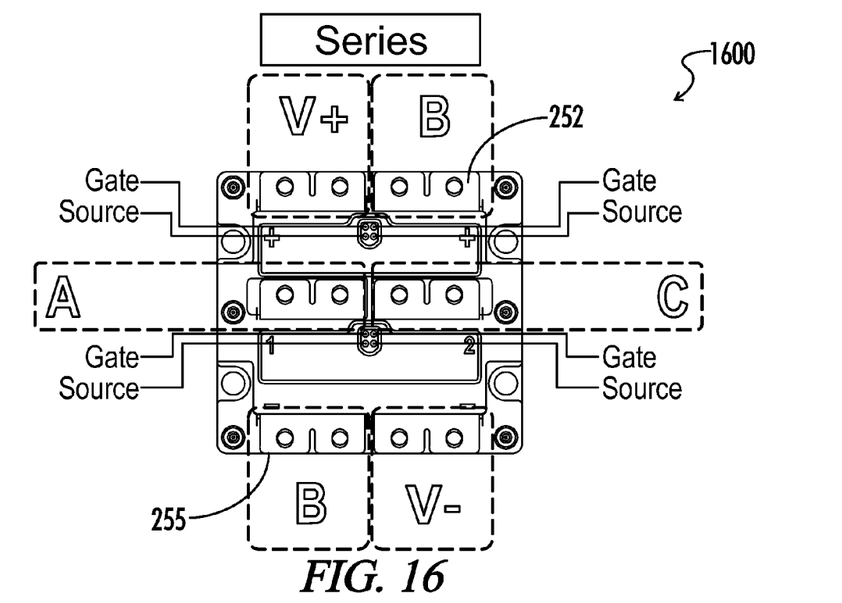
FIG. 16 is a schematic view of a series configuration.

FIG. 16 shows a series connection 1600. While not as common as the half and full bridge topologies, a series connection 1600 is useful for multi-level converter topologies and is configured as shown. In this case, only the second power contact 252 and the fifth power contact 255 are connected together, and the gate and source kelvin contacts are kept separate. This invention addresses the limitations of advanced power electronic systems through a novel high temperature (250° C.), high switching speed (10 s of ns), and high power (100 s of kW, depending on topology) half and full bridge module specifically designed to take advantage of silicon carbide (SiC) power electronic devices. This invention can include any high performance power device material, including but not restricted to silicon, silicon-carbide, gallium arsenide, gallium nitride, aluminum nitride, germanium, silicon germanium, diamond, etc. This invention can include any high performance power device, including but not restricted to diodes, Schottky diodes, PiN diodes, MOSFETs, JFETs, BJTs, thyristors, GTOs, IGBTs, IGCTs, HEMTs, etc.

Reference numerals used throughout the detailed description and the drawings correspond to the following elements:
four quadrant power module 100
top surface 102
bottom surface 104
left side 106
right side 108
head edge 110
foot edge 112
power circuit 200
power devices 202
first quadrant power section 204
second quadrant power section 206
third quadrant power section 208
fourth quadrant power section 210
power contacts 250
first power contact 251
second power contact 252
third power contact 253
fourth power contact 254
fifth power contact 255
sixth power contact 256
lower power substrates 260
first power substrate 261
second power substrate 262
third power substrate 263
fourth power substrate 264
fifth power substrate 265
and sixth power substrate 266
upper interconnection substrates 270
first gate source interconnection substrate 271
second gate source interconnection substrate 272
third gate source interconnection substrate 273
fourth gate source interconnection substrate 274
traces 275
clock tree equidistant path layout 276
central trunks 277
branches 278
first gate contact 281
second gate contact 282
third gate contact 283
fourth gate contact 284
first source contact 291
second source contact 292
third source contact 293
fourth source contact 294
first switch leg 301
second switch leg 302
parallel matched length current path distribution 400
housing 500
lid housing section 502
lid bolt securing apertures 503
lower profiled power contact clearance 504
lid bottom 505
raised gate source component clearance 506
power wire bond clearance 508
gate source insert 510
insert collars 511
connection apertures 512
left side housing section 520
fastener capturing apertures 522
side bolt securing apertures 523
clearance apertures 524
right side housing section 530
upper profiled power contact clearance 532
lower epoxy overhang 534
composite base plate 540
defines threaded bolt apertures 542
mounting apertures 544
connecting bolts 550
epoxy seal 560
captive fasteners 570
edge clamps 1202
center clamps 1204 four quadrant half bridge connection 1400
four quadrant full bridge connection 1500
four quadrant series connection 1600

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A four quadrant power module, comprising:
    a power circuit including power devices arranged in a first quadrant power section, a second quadrant power section, third quadrant power section, and fourth quadrant power section; a first quadrant power section including power devices connected from the first power substrate to the third power substrate,
    a second quadrant power section including power devices connected from the second power substrate to the fourth power substrate,
    a third quadrant power section including power devices connected from the third power substrate to the fifth power substrate,
    a fourth quadrant power section including power devices connected from the fourth power substrate to the sixth power substrate,
    a first power contact connected to the first power substrate;
    a second power contact connected to the second power substrate;
    a third power contact connected to the third power substrate;
    a fourth power contact connected to the fourth power substrate;
    a fifth power contact connected to the fifth power substrate;
    a sixth power contact connected to the sixth power substrate;
    a first gate source interconnection substrate connected to at least one power device, the first gate source interconnection substrate including a first gate contact and a first source contact;
    a second gate source interconnection substrate connected to at least one power device, the second gate source interconnection substrate including a second gate contact and a second source contact;
    a third gate source interconnection substrate connected to at least one power device, the third gate source interconnection substrate including a third gate contact and a third source contact;
    a fourth gate source interconnection substrate connected to at least one power device, the fourth gate source interconnection substrate including a fourth gate contact and a fourth source contact;
    each upper interconnection substrate including traces in a clock tree equidistant path layout having at least one central trunks connected to branches.

2. The four quadrant power module of claim 1, connected in a four quadrant full bridge connection.

* * * * *